United States Patent
Brusic et al.

(10) Patent No.: US 6,632,377 B1
(45) Date of Patent: Oct. 14, 2003

(54) CHEMICAL-MECHANICAL PLANARIZATION OF METALLURGY

(75) Inventors: Vlasta Brusic, Geneva, IL (US); Daniel C. Edelstein, New Rochelle, NY (US); Paul M. Feeney, Richmond, VT (US); William Guthrie, Saratoga, CA (US); Mark Jaso, Fairfax Station, VA (US); Frank B. Kaufman, Geneva, IL (US); Naftali Lustig, Croton-on-Hudson, NY (US); Peter Roper, Clinton Corners, NY (US); Kenneth Rodbell, Sandy Hook, CT (US); David B. Thompson, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/409,798

(22) Filed: Sep. 30, 1999

Related U.S. Application Data

(60) Provisional application No. 60/105,470, filed on Oct. 23, 1998.

(51) Int. Cl.[7] .................. C09K 13/00; C09K 13/06; H01L 21/302
(52) U.S. Cl. .................. 252/79.1; 252/79.4; 438/692
(58) Field of Search .............. 438/692; 252/79.1, 252/79.2, 79.4

(56) References Cited

U.S. PATENT DOCUMENTS

| | | | |
|---|---|---|---|
| 4,632,727 A | 12/1986 | Nelson | 156/656 |
| 4,789,648 A | 12/1988 | Chow et al. | 437/225 |
| 4,910,155 A * | 3/1990 | Cote et al. | 438/16 |
| 4,944,836 A | 7/1990 | Beyer et al. | 156/645 |
| 4,954,142 A | 9/1990 | Carr et al. | 51/309 |
| 5,225,034 A | 7/1993 | Yu et al. | 156/636 |
| 5,264,010 A * | 11/1993 | Brancaleoni et al. | 51/308 |
| 5,340,370 A | 8/1994 | Cadien | 51/308 |
| 5,354,490 A | 10/1994 | Yu et al. | 252/79.1 |
| 5,397,741 A * | 3/1995 | O'Connor et al. | 438/672 |
| 5,451,551 A | 9/1995 | Krishnan et al. | 437/241 |
| 5,516,346 A | 5/1996 | Cadien | 51/308 |
| 5,527,423 A | 6/1996 | Neville et al. | 156/636.1 |
| 5,676,587 A | 10/1997 | Landres et al. | 451/57 |
| 5,695,384 A * | 12/1997 | Beratan | 451/28 |
| 5,770,095 A | 6/1998 | Sasaki et al. | 216/38 |
| 5,773,364 A * | 6/1998 | Farkas et al. | 438/692 |
| 5,827,781 A * | 10/1998 | Skrovan et al. | 438/692 |
| 5,897,375 A | 4/1999 | Watts et al. | 438/693 |
| 5,954,997 A | 9/1999 | Kaufman et al. | 252/79.1 |
| 6,063,306 A | 5/2000 | Kaufman et al. | 252/79.4 |
| 6,117,775 A * | 9/2000 | Kondo et al. | 438/690 |

FOREIGN PATENT DOCUMENTS

| | | | |
|---|---|---|---|
| EP | 0 659 858 A2 | 6/1995 | C09G/1/02 |
| EP | 0 747 939 A2 | 12/1996 | H01L/21/321 |
| EP | 0 846 742 A2 | 6/1998 | C09G/1/02 |
| WO | WO 98/49723 | 11/1998 | H01L/21/321 |

OTHER PUBLICATIONS

Carpio R et al. "Initial Study on Copper CMP Slurry Chemistires" Thin Solid Films, CH, Elsevier–Sequoia S.A. Lausanne, vol. 266, No. 2. Oct. 1, 1995 ppg. 238–244.
European Search Report dated Apr. 10, 2000.
V.A. Brusic, et al., "Alkaline Formulations for Chemical Mechanical Polishing of Copper Utilizing Azole Passivation", IBM Tech. Bull., vol. 37, No. 10, Oct. 1994.

(List continued on next page.)

*Primary Examiner*—Benjamin L. Utech
*Assistant Examiner*—Lynette T. Umez-Eronini
(74) *Attorney, Agent, or Firm*—Anthony L. Canale

(57) ABSTRACT

Copper or a copper alloy is removed by chemical-mechanical planarization (CMP) in a slurry of an oxidizer, an oxidation inhibitor, and an additive that appreciably regulates copper complexing with the oxidation inhibitor.

10 Claims, 1 Drawing Sheet

OTHER PUBLICATIONS

Q. Luo, et al., "Chemical–Mechanical Polishing of Copper In Acidic Media", Feb. 22–23, 1996 CMP–MIC Conference, 1996 ISMIC–100P/96/0145.

P. Singer, et al., "Tantalum, Copper and Damascene: The Future of Interconnects", Semiconductor International, Jun. 1998, p. 91.

D. Edelstein, et al., "Full Copper Wiring in a Sub–0.25um CMOS ULSI Technology", Dec. 97, IEDM.

S.P. Murarka, et al., "Chemical Mechanical Polishing of Copper In Glycerol Based Slurries", Mat. Res. Soc., Symp. Proc., Pittsburgh, PA, vol. 427, pp. 237–242, 1996.

* cited by examiner

CHEMICAL-MECHANICAL PLANARIZATION OF METALLURGY

This application claims the benefit of U.S. Provisional Application No. 60/105,470, filed Oct. 23, 1998.

FIELD OF THE INVENTION

The present invention relates generally to integrated circuit metallization, and more particularly to a method of planarizing copper wiring.

BACKGROUND OF THE INVENTION

In the field of integrated circuit manufacturing, it is well known that significant density advantages result from forming planar metallization patterns (where the "metallization patterns" interconnect one or more transistors, capacitors, resistors, and other semiconductor electronic components formed on a wafer). One of the significant trends in the industry is to produce such planar metallization patterns using so-called "chemical-mechanical polish" (or "chem-mech polish" or "CMP") techniques. In CMP, the frontside of the wafer is held against a rotating polish wheel, and a chemical slurry is introduced that facilitates the removal of one or more metal layers on the wafer through a combination of chemical reaction and physical abrasion. See for example U.S. Pat. No. 4,944,836, issued Jul. 31, 1990 to Beyer et al. and assigned to the assignee of the present invention (a CMP method of planarizing metal relative to surrounding passivation, or planarizing passivation relative to metallurgy).

In addition to the general advantages afforded by CMP, particular density advantages result from forming an integrated metallurgy in pre-planarized passivation. That is, as shown in U.S. Pat. No. 4,789,648, issued Dec. 6, 1988 to Chow et al and assigned to the assignee of the present invention (hereinafter the "Chow patent"), integrated metallurgy (that is, a single layer of metal that includes both a vertical portion that extends down to underlaying layers on a wafer to contact conductive structures formed thereon, and horizontal portions that provide electrical interconnection) can be formed by depositing and defining apertures through two passivation layers that are planarized by CMP, then depositing metal over the entire structure and polishing away portions of the metal that extend above the planarized passivation layers. Normally, the horizontal and vertical portions of the metallurgy are formed using two layers of metal; the Chow patent maximizes conductivity by eliminating the interlayer interface that normally exists between the horizontal and vertical portions of the metallurgy structure.

In the prior art, it is well known to utilize aluminum alloys or tungsten as the metallurgy for integrated circuits. However, the conductivity characteristics of these materials may not be sufficient as the minimum on-chip dimensions decrease below 0.25 um. These metallurgies are typically deposited on the wafer utilizing chemical vapor deposition and other deposition techniques. As interconnect dimensions are reduced the aspect ratio (that is, the ratio of height relative to width) of vias, or openings, formed through interlevel dielectrics increases, leading to voids in metals deposited utilizing directional techniques. In addition, at smaller geometries metal lines become more susceptible to electromigration-induced faults. Thus, a recent development in the art has been the development of copper metallurgies. Copper has low resistivity, high electromigration resistance, and can be deposited by electroplating techniques that greatly reduce void formation. However, because copper is a soft metal without a highly protective native oxide, and cannot be easily patterned using standard reactive ion etching techniques, it presents unique challenges, particularly in the area of CMP. Various slurries for CMP of copper (and/or barrier materials for copper) have been proposed in the prior art. These techniques include the following:

1) nitric acid, a polymer, a surfactant, and sulfuric or sulfonic acid for removing copper from printed circuit boards in a non-CMP process (U.S. Pat. No. 4,632,727, to Nelson and assigned to Psi Star);

2) iron-amononia-EDTA (U.S. Pat. No. 4,954,142, to Patrick, et al. and assigned to the assignee of the present invention);

3) water, a solid abrasive, and one of HNO3, H2SO4, and AgNO3 (U.S. Pat. No. 5,225,034 and divisonal 5,534, 490 to Yu et al. and assigned to Micron Technology);

4) an oxidizing agent and a silica abrasive, the slurry having a pH between 2 and 4, to polish tungsten, copper, titanium nitride, or tungsten silicide (U.S. Pat. No. 5,340,370 and divisional 5,516,346, to Cadien et al. and assigned to Intel);

5) ammonium persulfate/KOH with a pH of 10 ("Alkaline Formulation for Chemical Mechanical Polishing of Copper Utilizing Azole Passivation", IBM Technical Disclosure Bulletin, Vol. 37, No. 10, October 1994 Pg. 187));

6) silica or alumina grains, aminoacetic acid, and hydrogen peroxide (European Patent Application 94119785.7, published Jun. 28, 1995, based on JP 313406/93);

7) colloidal silica, sodium chlorite, and deionized water (U.S. Pat. No. 5,451,55 1, issued Sep. 5, 1995 to Krishnan et al.);

8) an oxidizing agent, a surfactant, and deionized water, with a uniform dispersion of alumina particulates that have an aggregate size distribution of less than about one micron and an average diameter less than approximately 0.4 microns (U.S. Pat. No. 5,527,423, issued Jun. 18, 1996 to Neville et al and assigned to Cabot Inc.);

9) ferric nitrate, BTA, poly(ethylene glycol) and alumina particulates ("Chemical-Mechanical Polishing of Copper In Acidic Media," Luo et al., 1996 CMP-MIC Conference, Feb. 22–23, 1996, pp. 145–51);

10) use of alumina particulates in a first CMP slurry to polish the bulk metal (tungsten or copper), followed by use of silica particulates in a second CMP slurry to polish an underlayer of Ti/TiN (U.S. Pat. No. 5,676, 587, issued Oct. 14, 1997 to Landers et al. and assigned to the assignee of the present invention); and 11) Silica, glycine, and BTA (U.S. Pat. No. 5,770,095 to Sasaki et al., and assigned to Toshiba Corp.).

In general, the prior art set forth above deals with polishing of copper (in some cases with barrier materials) in conventional metal line or stud via applications. However, when polishing metal as shown in the Chow patent, particular challenges are presented that must be addressed in the CMP process.

SUMMARY OF THE INVENTION

In the invention, copper is removed by CMP in a slurry that comprises an oxidizer, an oxidation inhibitor, and an additive that appreciably regulates copper complexing with the oxidation inhibitor, resulting in a high removal rate of copper without appreciable removal of the underlying metallic and dielectric layers or copper corrosion, and with minimal loss of copper in patterned interconnects.

BRIEF DESCRIPTION OF THE DRAWING

The above and other aspects of the present invention will become more clear upon review of the detailed description of the invention as set forth below. In the description to follow, reference will be made to the accompanying Drawing, in which.

DETAILED DESCRIPTION OF THE BEST MODE FOR CARRYING OUT THE INVENTION

Figure 1:
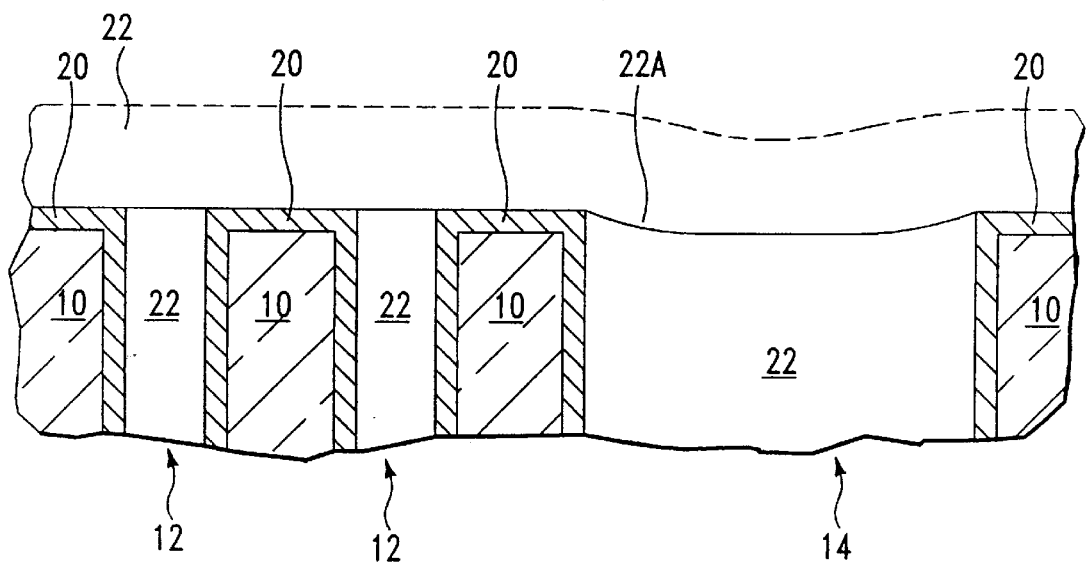
FIG. 1 is a cross sectional view of a substrate with a layer of copper thereon undergoing the CMP process of the invention.

As shown in FIG. 1 of the present application, oxide 10 has narrow openings 12, and wide openings 14 that define the metal lines. Each opening is filled with liner 20 and copper 22. In the invention, the portions of the metal layer 22 (shown in dashed lines) formed above the upper surface of the liner 20 are removed by CMP, utilizing the polishing slurry of the invention, resulting in the final upper surface 22A.

During this operation, four goals are to be achieved: high chemical mechanical removal rate of copper 22; a low removal rate of the liner material 20; low removal rate of the underlying dielectric 10; and prevention of copper corrosion. Clearly, one goal is to maximize the removal rate of the copper, because the faster the polish process is, the more wafers can be processed per unit time, and the lower the overall semiconductor manufacturing cost. The second goal, minimizing the removal rate of the liner 20 during the copper CMP, step provides for a good polish stop and leads to minimal loss of copper in the trenches 14. This loss of metal is typically refered to as "dishing," and is shown schematically in FIG. 1. As to the third goal, since as a practical matter there could be some loss of liner, especially at corners of trenches 14, one wants to minimize the removal rate of the exposed dielectric layer 10. Excess removal of the underlaying dielectric introduces nonplanarity in the final surface which can lead to difficulties in subsequent process steps. Finally, since copper is highly corrodible, we need to ensure that any corrosive aspects of the removal process are minimized. These four goals of the copper CMP process (high removal rate of copper, without appreciable removal of the underlaying liner and dielectric, and without appreciable corrosion) can often be incompatible. For example, in the prior art removal rate of the bulk metal is often sacrificed in order to prevent excessive liner removal. Higher removal rates of the bulk metal are achieved at the expense of excess dishing of patterns or corrosion of the copper.

In the invention as shown in FIG. 1, the liner 20 is on the order of 40 nm thick, and is comprised of tantalum. Alternatives include other tantalum alloys such as tantalum nitride, as well as other refractory metals and refractory metal alloys such as tungsten, chromium, and titanium/titanium nitride. A Ta-based barrier layer appears to provide the best combination of (a) promoting adhesion of copper to the oxide layer 10, (b) preventing diffusion of copper, which can have adverse electrical effects on the underlaying silicon circuitry, and (c) providing rate selectivity to copper during the CMP process. Then the copper 22 is deposited onto the wafer, to a thickness (measured from the upper surface of oxide layer 10 to the upper surface of the copper layer) of approximately one micron. The copper layer can be formed using any deposition process that adequately fills the trenches in oxide layer 10 without the formation of voids.

Figure 2:
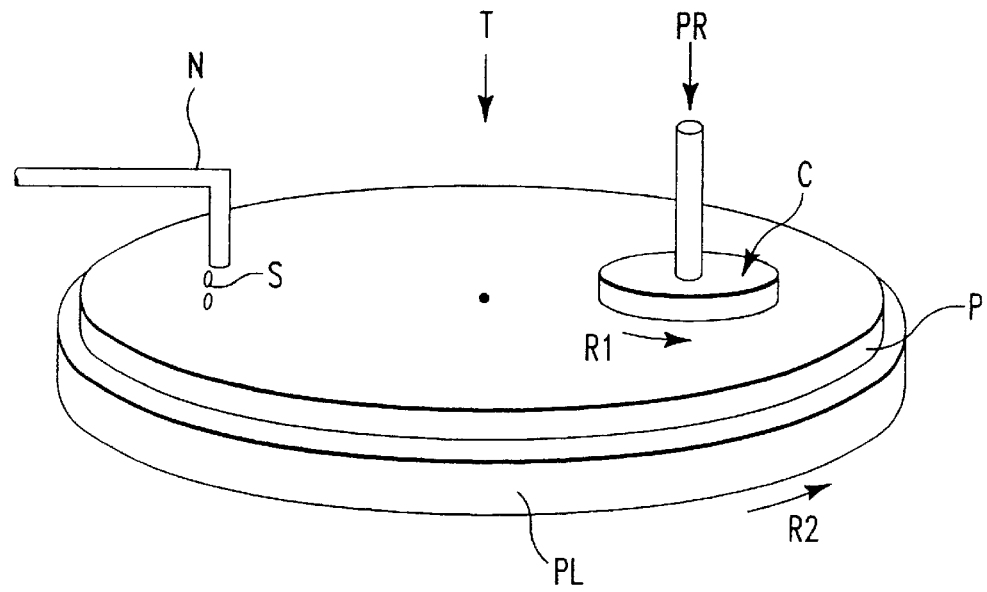
FIG. 2 is a schematic perspective view of the CMP tool for carrying out the process of the invention.

The copper layer is then removed via CMP to remove portions of these metal layers that overlay the upper surface of the passivation layer, so as to form a planar surface. In practice, as shown in FIG. 2, the workpiece of FIG. 1 is placed within a carrier C of a CMP tool T. Any one of a number of known CMP tools, including those available from IPEC Corp. and Strasbaugh Corp. could be used to carry out the present CMP operation. The CMP tool T has a rotating polish wheel (or platen) PL on which is mounted a polish pad P. The CMP slurry of the invention is applied onto the polish pad P via nozzle N, and the carrier C brings the wafer into contact with the polish pad P. In practice, the carrier C spins in a direction R1 complementary to that of the polish wheel R2. In the operation described below, typically the polish wheel rotates at a speed of approximately 40–100 revolutions per minute (RPM), and the wafer holder spins at a speed of approximately 20–100 RPM. Further, the wafer holder applies pressure PR to force the carrier C carrying the wafer against the polish pad P. Urethane pads such as the IC1000 from Rodel, foam pads such as the Politex from Rodel, and other pad types can also be used with the slurry, but the inventors found that nonwoven pads such as those available from Freudenberg or Thomas West Inc. optimize the overall results in this application. In the operation described below, the applied pressure PR is approximately 3–6 pounds per square inch (PSI). In practice, these three variables (spin speed of the wafer holder, rotation speed of the polish pad, pressure) are interrelated, and can and do vary as a function of e.g. the hardness and thickness of the layer to be polished.

In the slurry of the invention, solids such as alumina particulates having an aggregate diameter at or below approximately 0.3 microns are used to enhance the physical abrasion in the reaction while minimizing excessive scratching or other surface damage. The slurry includes the following components:

1) an etchant that promotes copper oxidation, such as ferric nitrate and compounds thereof, hydrogen peroxide, potassium iodate, manganese oxide, ammonium hydroxide, ammonium persulphate, potassium persulphate, ammonium persulphate/sulfuric acid, potassium persulphate/sulfuric acid, ferric chloride/hydrochloric acid, chromic acid, chromic acid/hydrochloric acid, potassium bichromate/sulfuric acid, and stearic acid Fe(III) salts;

2) an inhibitor that prevents copper dissolution by reacting with the copper surface, such as various benzotriazole compounds sold under the tradename "BTA" (e.g. 1-H benzotriazole, 1-OH benzotriazole, 1-CH3 benzotriazole, 5-CH3 benzotriazole, benzimidazole, 2 OH, 2-methyl-benzimidazole, 5-Cl benzotriazole); and 3) an additive consisting of a mixture of sodium salts of sulfated fatty alcohols that competes with BTA for Cu reaction sites to slow down Cu-BTA film growth, and acts as a wetting agent, as will be described in more detail below.

Before describing the process in detail, the chemical reactions to be optimized will be generally explored. In the present invention, CMP of copper generally involves a steady state process whereby a few monolayers of a Cu-BTA thin film are formed during the exposure of copper to one of the oxidizers and inhibitors listed in (1&2) above. (The Cu-BTA film is on the order of 14 angstroms thick when ferric nitrate is used as an oxidizer and benzotriazole is the inhibitor). This Cu-BTA film, which prevents rapid uncontrolled dissolution of copper, is then removed by physical abrasion (i.e. by the solid particulates in the CMP slurry). As the first monolayers are removed, the exposed copper goes through the above-described reaction to form new Cu-BTA monolayers. In terms of planarization, this process is inherently faster on higher portions of the Cu layer, because the polishing pad of the CMP tool imparts a greater pressure against such higher portions, promoting the physical abrasion portion of the reaction; in the lower portions of the Cu layer, there will be less physical abrasion, hence the reaction proceeds slower until such time as the upper surface of the Cu layer is planar (and hence is subjected to equal pressure from the polish pad). This cycle of abrasion/dissolution/passivation continues until the portions of the tantalum layer 20 on the upper surface of passivation 10 are exposed. The above-described cycle must be optimized to occur at the right rate. If the Cu-BTA reaction rate is high and a thick Cu-BTA layer is formed, the CMP removal rate decreases. In the case of a very slow reaction rate one runs the risk of corroding (uncontrolled dissolution) the copper interconnects. For abrading the Cu-BTA an aqueous colloidal suspension of alumina Al2O3) is used. The use of a colloidal alumina with small particle size (as well as a nonwoven polish pad, as discussed below) was found to reduce scratching of the soft copper interconnects. Maintaining the slurry at low pH (on the order of 1.2–2.5) is done in order to enhance the removal rate of copper metal relative the underlying dielectric.

The inventors found that an additive, Duponol SP, a DuPont Company trade name for a mixture of sodium salts of sulfated fatty alcohols, was essential to enhancing the Cu slurry performance. Duponol SP is also known as Supralate SP from Witco Corporation, and Empimin LV33/A from Albright and Wilson Americas Inc. While the prior art utilizes surfactants to promote CMP slurry colloidal suspension, in the present invention the additive is used to enhance the CMP removal rates of copper. In the present formulation the slurry is maintained in suspension through mechanical stirring rather than by surfactant/alumina interactions. The surfactant disclosed here is an anionic surfactant of a considerably shorter chain length and lower molecular weight than the one used for example in the aforecited Luo et al. article. The Luo et al. article teaches use of a nonionic surfactant, poly (ethylene glycol), having a molecular weight on the order of 1 Million, in order to promote slurry suspension by steric repulsion. The use of a lower molecular weight poly(ethylene glycol) (MW=10,000) was found by Luo et al. to be ineffective in maintaining the slurry suspension. When the present inventors used a Duponol-free, alumina/BTA/ferric nitrate slurry, the abrasive remained in suspension, but the Cu CMP removal rate was less than 50 nm/minute; it was only after adding Duponol SP, that the CMP removal rate rose to approximately 300 nm/minute, which is beneficial for efficient semiconductor manufacturing. The present inventors believe that Duponol SP competes with BTA for adsorption sites on the copper surface, thus limiting the overall thickness of the copper-BTA surface layer, leading to the observed increase in CMP removal rates. In general, the Duponol SP serves to appreciably regulate the Cu-BTA complexing reaction, such that it occurs at the right rate to maximize the overall rate of Cu polishing while retarding corrosion. It is also noted that Duponol SP, because of its relatively low molecular weight, is very effective in reducing solution surface tension. When included in the copper slurry it enhances the wetting of the copper surface by the slurry/polish pad system which further enhances the polishing rate.

Duponol is described in the Merck Index (Eleventh Edition, S. Budavari, Ed. Publ. Merck & Co. Inc., Rahway, N.J., p. 683 (1989)) as a "Gardinol type detergent" mixture of sodium salts of sulfated fatty alcohols made by reducing the mixed fatty acids of coconut oil or cottonseed oil and of fish oils. As such, it has a distribution of hydrocarbon chain length (C8–C18) with the 8-atom carbon chain length being the main component in the case of Duponol SP. Pure sodium octyl sulfate, $(CH_3)(CH_2)_7OSO_3Na$, (numbers are subscripts) was also found to enhance the Cu CMP removal rate, albeit at higher concentrations than those required for Duponol SP.

It is noted that the pure alkyl sulfates are considerably more expensive than their 'natural' counterparts and thus of less practical value in a manufacturing environment. Sodium octyl sulfates are characterized by a relatively high critical micelle concentration (CMC=$1.4 \times 10^{-1}$ M at 40C in H2O), where CMC is the concentration at which colloid clusters of agglomerated surfactant molecules (micelles) start to form. The high CMC implies that a higher concentration of monomers can reach the copper/polishing pad interface before the onset of micelle formation, and thus can better regulate the Cu-BTA film formation. Also, since it is the monomeric form which contributes to reduction of interfacial tension and improved wetting, a high CMC surfactant is desirable. The Duponol concentrations used in the present slurry are estimated to be at or below the CMC, such that an appreciable amount of micelles are not formed.

Based on the foregoing, the inventors believe that in addition to Duponol SP and pure sodium octyl sulfate, other fatty alcohol sulfate surfactants would work that have a relatively low molecular weight (less than approximately 350) and have a relatively high CMC. Some examples include sodium octyl sulfate and longer chain derivatives, sodium octyl sulfonate and longer chain derivatives, and Duponol WN which is a mixture of sodium octyl and decyl sulfate. Duponol WN is also known as Supralate WN from Witco Corp. or Empicol LB33/A from Albright and Wilson Americas, Inc.

In addition, the inventors found that this slurry did not appreciably remove the underlying tantalum layer 20 or the oxide 10. At Cu removal rates on the order of 300 nm/minute, the above-described slurry also resulted in a removal rate ratio on the order of 100:1 to the underlying liner, and ratios in excess of 100:1 to the underlying oxide. Even at high alumina concentrations (3% solids), copper CMP removal rate ratios above 50:1 to the above materials were observed. In particular, the inventors found that the use of colloidal alumina particulates greatly enhanced removal rate selectivity of copper to the tantalum liner. While other particulates (such as colloidal silica) abrade copper and the underlying tantalum based films non-selectively, as discussed above, the inventors found that the above slurry with alumina particulates does not appreciably attack tantalum.

The inventors have found that controlling temperature during the polish process is important to maximize copper removal rate while minimizing dishing. More specifically, the inventors have found that the temperature of the slurry increases as the polish proceeds, due to the frictional forces inherent in the polish process as well as the temperature-activated chemical components of the above-specified copper complexing reaction. The inventors have found that if the temperature rises above approximately 100 degrees F, dishing of patterned wide lines results, because the polishing pad softens and begins to deform while at the same time the chemical component/etching of the CMP process increases. In practice, this temperature control is achieved by utilizing a water-cooled polishing platen.

EXAMPLE 1

A workpiece prepared as above was polished in a colloidal alumina dispersion having particulates on the order of 0.3 microns or less, available, for example, from Cabot Corporation and other suppliers. This grain size appears to provide the optimum tradeoff between enhanced Cu removal rates and low removal rate in the barrier film, while reducing scratching in the Ta film. The slurry included 18 liters deionized water (0.3% alumina), 1.2 grams/liter BTA, 22 grams/liter ferric nitrate, and 3 ml/liter Duponol SP, such that the total slurry had a pH of approximately 1.5. The resulting removal rate was approximately 300 nm/minute, and the removal rate ratio was approximately 100:1 to the underlaying Ta layer.

EXAMPLE 2

A workpiece prepared as above was polished in a colloidal alumina dispersion having particulates on the order of 0.3 microns or less, as described above. The slurry included 18 liters deionized water. In a series of experiments, 1) The BTA, ferric nitrate, and Duponol SP concentrations were held constant, and the percent of alumina solids was varied between 0.1% and 3%, with no appreciable effect on Cu removal rate or Ta selectivity. Above approximately 3% solids the selectivity to Ta began to decrease, albeit by a relatively low amount. Based on these results the inventors speculate that selectivity would still be acceptable up to approximately 15% solids (0.3% is preferred to maximize selectivity while minimizing expense, since increased % solids increases the overall cost of the slurry);

2) The percent alumina solids, ferric nitrate, and Duponol SP concentrations were held constant, and the amount of BTA was varied between 0.1 grams/liter and 4 grams/liter. Below approximately 0.5 grams/liter Cu corrosion was present; between approximately 0.5 grams/liter and 3 grams/liter the Cu CMP rate was fairly uniform; and above approximately 3 grams/liter removal rate begins to decrease;

3) The percent alumina solids, BTA, and Duponol SP concentrations were held constant, and the ferric nitrate concentration was varied between 2 grams/liter and 40 grams/liter. Below approximately 2 grams/liter the Cu removal rate dropped off exponentially; above approximately 2 grams/liter the removal rate rose linearly; above approximately 25 grams/liter removal rate did not increase significantly; and 4) The percent alumina solids, BTA, and ferric nitrate concentrations were held constant, and the Duponol SP concentration was varied. Below approximately 3 ml/liter Cu CMP removal rate decreased; no appreciable change in etch rate was observed at higher Duponol SP concentrations.

In addition to pure copper, the present invention is applicable to copper alloys that would be polished in accordance with the reaction kinetics described above (e.g. copper with up to approximately 5% of various metals such as Al, Sn, In, Ti, Ag, Mo, Zr, Mg, Cr, Au, and Pb).

It is to be understood that the above and other modifications can be made to the preferred embodiment as set forth above without departing from the spirit and scope of the present invention. For example, in Example 2 the relative concentrations of the main elements of the slurry were varied individually. The inventors note that the concentrations of some of the constituents are directly related to one another, such that if the percentage concentration of one constituent was changed the concentrations of the other related constituents would change porportionately. As a specific example, if the ferric nitrate concentration were to be dropped below 2 grams/liter, the BTA concentration could drop below the low end of the concentration range set forth in Example 2.

What is claimed is:

1. A CMP slurry for polishing a layer of copper or a copper alloy integrated circuit metallization on a liner layer, said slurry providing a first removal rate of said copper or copper alloy and a second removal rate of said liner layer, said first removal rate being at least fifty times greater than said second removal rate, comprising an inorganic etachant that promotes copper oxidation, an oxidation inhibitor which reacts with copper to form a passivating layer which retards the oxidation of copper, and at least about 3 ml of sodium octyl sulfate per liter of said slurry that appreciably regulates reaction between copper and said oxidation inhibitor to limit the formation of said passivating layer by competing for adsorption sites on the surface of said copper.

2. The slurry as recited in claim 1, wherein said etchant is selected from the group consisting of ferric nitrate and compounds thereof, hydrogen peroxide, potassium iodate, manganese oxide, ammonium hydroxide, ammonium persuiphate, potassium persulphate, ammonium persulphate/sulfuric acid, potassium persulphate/sulfuric acid, ferric chloride/hydrochloric acid, chromic acid, chromic acid/hydrochloric acid, potassium bichromate/sulfuric acid, and steric acid Fe(III) salt.

3. The slurry as recited in claim 2, where in said etchant comprises ferric nitrate.

4. The slurry as recited in claim 1, wherein said oxidation inhibitor is selected from the group consisting of 1-H benzotriazole, 1-OH benzotriazole, 1-CH3 benzotriazole, 5-CH3 benzotriazole, benzimidazole, 2 OH, 2-methylbenzimidazole, and 5-Cl benzotriazole.

5. The slurry as recited in claim 1, wherein said oxidation inhibitor comprises BTA.

6. The slurry as recited in claim 1, wherein said sodium octyl sulfate does not form an appreciable amount of micelles.

7. The slurry as recited in claim 1, further comprising colloidal alumina.

8. The slurry as recited in claim 7, wherein said colloidal alumina has particulates having a size less than approximately 0.3 microns.

9. The slurry as recited in claim 1, wherein said slurry has a pH of approximately 1.2–2.5.

10. The slurry as recite in claim 2, wherein said inorganic etchant comprises at least approximately 2 grams per liter of said slurry.

* * * * *